(12) United States Patent
Katsuki et al.

(10) Patent No.: US 7,593,252 B2
(45) Date of Patent: Sep. 22, 2009

(54) SEMICONDUCTOR APPARATUS HAVING SHIELD LINE PROVIDED BETWEEN INTERNAL LAYER AND INPUT/OUTPUT LINE IN LAYOUT CELL

(75) Inventors: Nobuyuki Katsuki, Kanagawa (JP);
Hirofumi Nikaido, Kanagawa (JP);
Michihiro Kobayashi, Kanagawa (JP);
Yasuhiro Kawakatsu, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 125 days.

(21) Appl. No.: 11/798,736

(22) Filed: May 16, 2007

(65) Prior Publication Data
US 2007/0267760 A1    Nov. 22, 2007

(30) Foreign Application Priority Data
May 17, 2006    (JP)    .............................. 2006-138210

(51) Int. Cl.
*G11C 11/00*    (2006.01)

(52) U.S. Cl. ................... 365/154; 365/156; 365/230.06

(58) Field of Classification Search ................. 365/154, 365/156, 230.06
See application file for complete search history.

(56) References Cited

U.S. PATENT DOCUMENTS

| 5,808,930 | A   | * | 9/1998  | Wada et al. .................... 365/63 |
| 6,717,833 | B2  | * | 4/2004  | Kitsukawa et al. ............ 365/63 |
| 6,922,354 | B2  | * | 7/2005  | Ishikura et al. ............. 365/154 |
| 6,980,462 | B1  | * | 12/2005 | Ramesh et al. .............. 365/154 |
| 7,411,256 | B2  |   | 8/2008  | Hashimoto |

FOREIGN PATENT DOCUMENTS

| CN | 1630086 A    | 6/2005 |
| JP | 2005-183420  | 7/2005 |

OTHER PUBLICATIONS

Chinese Office Action dated Jun. 5, 2009 with English-language translation.

* cited by examiner

*Primary Examiner*—Connie C Yoha
(74) *Attorney, Agent, or Firm*—McGinn IP Law Group, PLLC

(57) ABSTRACT

A semiconductor apparatus includes an internal layer where a first power supply line to provide a first power supply to transistors in a layout cell and an internal cell line to connect transistors in the layout cell are placed, an input/output line connected with an input/output terminal of the layout cell is placed, and a shield line which is placed between the internal layer and the input/output line so as to cover the internal layer and the first power supply line.

14 Claims, 13 Drawing Sheets

US 7,593,252 B2

SEMICONDUCTOR APPARATUS HAVING SHIELD LINE PROVIDED BETWEEN INTERNAL LAYER AND INPUT/OUTPUT LINE IN LAYOUT CELL

BACKGROUND OF THE INVENTION

1. Field of the Invention

The present invention relates to a semiconductor apparatus and, particularly, to a semiconductor apparatus having a shield line between a device and a line layer placed above the device.

2. Description of Related Art

A manufacturing process of semiconductor apparatus is recently moved to finer design rules. As the manufacturing process gets finer, the noise immunity of semiconductor apparatus decreases due to reduction of parasitic capacitance at a drain (drain capacitance) and shortening of a distance between lines.

One of the effects of the reduction in drain capacitance is a decrease in immunity against soft error that occurs due to cosmic radiation coming from the outside of semiconductor apparatus. One of the effects of the shortening of a distance between lines is signal interference between lines. The interference causes the signals that are transmitted through adjacent lines to appear as noise to each other, which leads to signal propagation error.

A technique to reduce the effects of the reduction in drain capacitance is disclosed in Japanese Unexamined Patent Application Publication No. 2005-183420 (which is referred to hereinafter as a related art). The related art aims to suppress the occurrence of soft error in an SRAM. FIG. 11 is a circuit diagram of an SRAM according to the related art. As shown in FIG. 11, the SRAM of the related art includes additional capacitors C1 and C2 respectively for nodes 101 and 102 (cross-coupling nodes) to store data. The additional capacitors C1 and C2 allow the capacitance of the nodes 101 and 102 to increase to thereby improve the soft error immunity.

Further, in the related art, a additional capacitor 130 is formed above an SRAM cell. FIG. 12 shows the layout of the SRAM according to the related art, and FIG. 13 shows the layout where the additional capacitor 130 is placed above an SRAM cell. As shown in FIG. 13, the capacitors C1 and C2 are appropriately placed in a layer above the SRAM cell in the related art. This eliminates the need for an additional area for the additional capacitors C1 and C2, which suppresses an increase in chip area.

However, the signal propagation error due to interference between lines is not addressed in the related art disclosed in Japanese Unexamined Patent Application Publication No. 2005-183420. In SRAM, a bit line is placed above the line to serve as a cross-coupling node. The voltage of the cross-coupling node has an amplitude between a power supply voltage VDD to a ground voltage VSS. Because the voltage of the cross-coupling node varies widely, the bit line placed above the cross-coupling node is subject to the effect (interference) of the voltage variation in the cross-coupling node. Thus, the voltage variation in the cross-coupling node can affect the bit line as noise.

SUMMARY

According to one aspect of the present invention, there is provided a semiconductor apparatus including an internal layer where a first power supply line to provide a first power supply to transistors in a layout cell and an internal cell line to connect transistors in the layout cell are placed, an input/output line layer where an input/output line connected with an input/output terminal of the layout cell is placed, and a shield line which is placed between the internal layer and the input/output line layer so as to cover the internal cell line and the first power supply line.

In the semiconductor apparatus according to the present invention, a shield line is formed to cover the internal cell line and the first power supply line. The shield line is placed between the internal layer and the input/output line layer. The shield line thereby blocks noises due to voltage variation occurring in the internal cell line or the first power supply line. This prevents interference between the internal cell line, the first power supply line and the input/output line. The semiconductor apparatus of the present invention thereby improves the reliability of signals on the input/output line.

The semiconductor apparatus according to the present invention is capable of preventing interference between an input/output line and an internal cell line formed therebelow.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
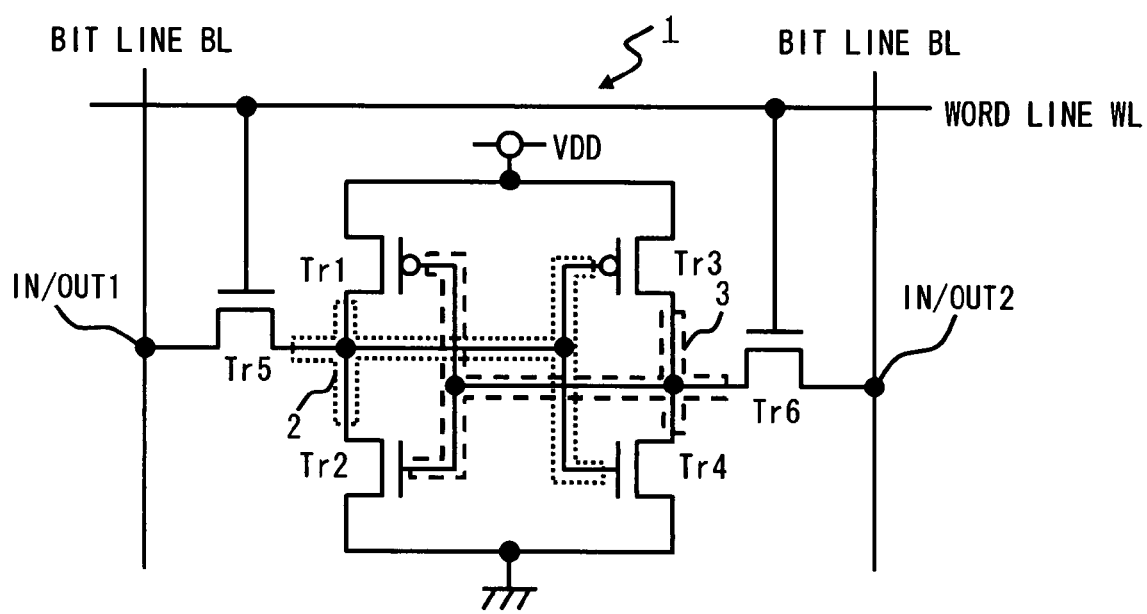
FIG. 1 is a circuit diagram of an SRAM according to a first embodiment of the present invention.

Exemplary embodiments of the present invention are described hereinafter with reference to the drawings. In the following embodiments, the present invention is applied to an SRAM (Static Random Access Memory) as an example of a semiconductor apparatus. FIG. 1 shows a circuit diagram of a SRAM 1.

As shown in FIG. 1, the SRAM 1 includes transistors Tr1 to Tr6. The transistors Tr1 and Tr3 operate as load transistors. The transistors Tr2 and Tr4 operate as drive transistors. The transistors Tr5 and Tr6 operate as transfer transistors. The transistors Tr1 and Tr2 are connected in series between the power supply voltage VDD and the ground voltage VSS. The transistors Tr3 and Tr4 are also connected in series between the power supply voltage VDD and the ground voltage VSS.

The gates of the transistors Tr3 and Tr4 are connected to a connection point between the transistors Tr1 and Tr2 and are connected to a bit line BL through the transistor Tr5. A connection point between the transistor Tr5 and the bit line BL serves as a first input/output terminal IN/OUT1 of the SRAM 1. The gates of the transistors Tr1 and Tr2 are connected to a connection point between the transistors Tr3 and Tr4 and are connected to a bit line BL through the transistor Tr6. A connection point between the transistor Tr6 and the bit line BL serves as a second input/output terminal IN/OUT2 of the SRAM 1. The gates of the transistors Tr5 and Tr6 are respectively connected to a word line WL.

In this embodiment, a line that is connected between the gates of the transistors Tr3 and Tr4 and the transistor Tr5 is called a cross-coupling node 2, and a line that is connected between the gates of the transistors Tr1 and Tr2 and the transistor Tr6 is called a cross-coupling node 3. The cross-coupling nodes 2 and 3 are storage nodes of the SRAM 1. The cross-coupling nodes 2 and 3 have a voltage level of the power supply voltage VDD or the ground voltage VSS, which varies according to the information to be stored.

Figure 2:
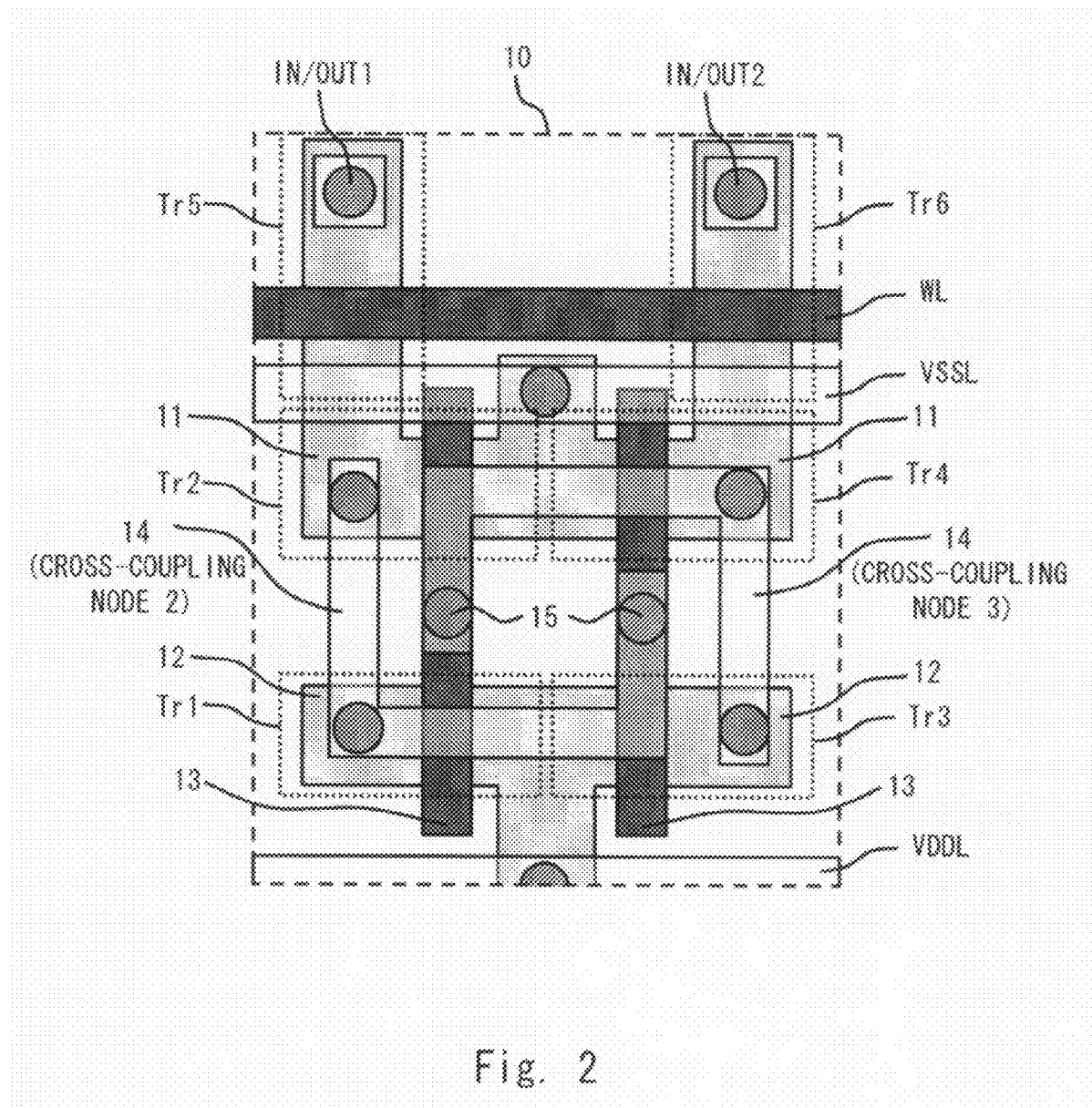
FIG. 2 is a view showing the layout of an SRAM cell according to the first embodiment of the present invention.

The semiconductor apparatus typically includes a plurality of SRAMs 1. The layout of each SRAM 1 is described hereinafter in detail. FIG. 2 schematically shows the layout of one SRAM 1 (SRAM cell 10). As shown in FIG. 2, the SRAM cell 10 includes diffusion areas 11 and 12, a gate area 13, a word line WL, a first power supply line (e.g. a local power supply line VDDL), a second power supply line (e.g. a local ground line VSSL), an internal cell line 14, and a via hole 15.

In the diffusion area 11, the sources or drains of the transistors Tr2, Tr4, Tr5 and Tr6 are formed. In the diffusion area 12, the sources or drains of the transistors Tr1 and Tr3 are formed. In the gate area 13, the gates of the transistors Tr1 to Tr4 are formed. The word line WL is formed as the gates of the transistors Tr5 and Tr6. The internal cell line 14 corresponding to the cross-coupling node 2 is formed to connect the gates of the transistors Tr3 and Tr4 and the drains of the transistors Tr1 and Tr2. The internal cell line 14 corresponding to the cross-coupling node 3 is formed to connect the gates of the transistors Tr1 and Tr2 and the drains of the transistors Tr3 and Tr4. In FIG. 2, the drain of the transistor Tr2 and the source of the transistor Tr4 are connected by the diffusion area 11 in an integral form. The drain of the transistor Tr4 and the source of the transistor Tr6 are also connected by the diffusion area 11 in an integral form.

The local power supply line VDDL supplies a first power supply (e.g. a power supply voltage VDD) to the transistors in the SRAM cell 10. It is connected to the area where the drains of the transistors Tr1 and Tr3 are formed. The local ground line VSSL supplies a second power supply (e.g. a ground voltage VSS) to the transistors in the SRAM cell 10. It is connected to the area where the sources of the transistors Tr2 and Tr4 are formed. The transistors Tr1 to Tr6, the internal cell line 14, the local power supply line VDDL and the local ground line VSSL are connected through the via hole 15.

Figure 3:
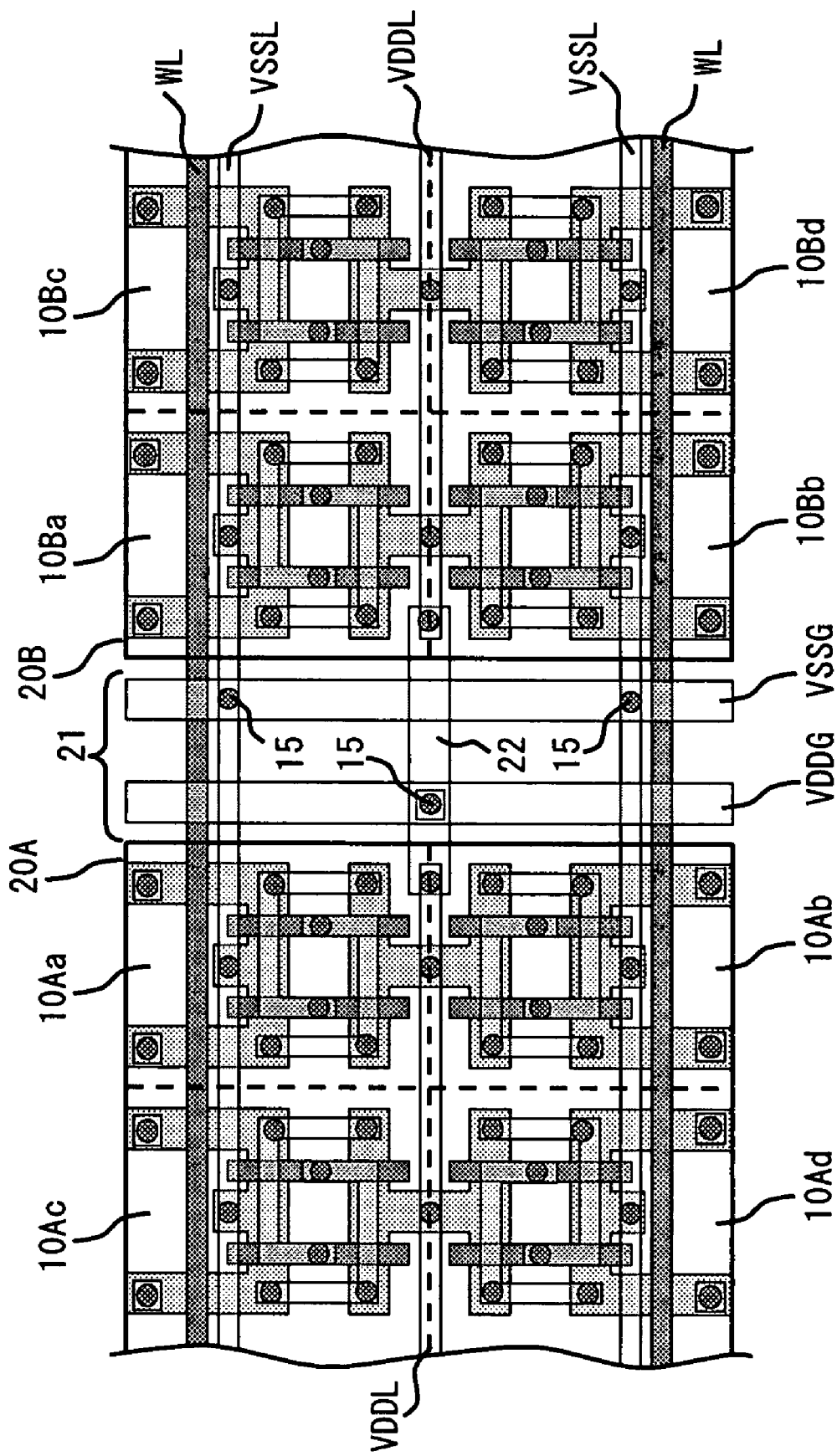
FIG. 3 is a view showing the layout of an SRAM using the layout cell according to the first embodiment of the present invention.

In the semiconductor apparatus of this embodiment, a layout cell 20 that includes a plurality of SRAM cells 10 shown in FIG. 2 is used as one layout unit. The layout cell 20 may include 16 SRAM cells 10, for example. FIG. 3 schematically shows the layout of the semiconductor apparatus where layout cells 20A and 20B are placed by way of illustration. In the following description, the longitudinal direction of the local power supply line VDDL which provides power supply to the transistors in the layout cell is referred to as a first direction, and the direction which is substantially orthogonal to the first direction is, referred to as a second direction. If one of a plurality of the layout cell is defined as a first layout cell, a second layout cell is adjacent to the first layout cell via the tap region 21 and, a third layout cell is adjacent to the first or second layout cell without any tap region.

As shown in FIG. 3, in the semiconductor apparatus of this embodiment, the layout cells 20A and 20B are placed adjacent to each other through a tap region 21. The tap region 21 is the area where a conductive line including a global power supply line VDDG that supplies a power supply voltage VDD to a plurality of layout cells and a global ground line VSSG that supplies a ground voltage VSS to a plurality of layout cells are formed. Though not shown in FIG. 3, a global word line WLG that supplies a voltage to the word line WL or the like may be also placed in the tap region 21.

For simplification, FIG. 3 illustrates only four SRAM cells which are included in each of the layout cells 20A and 20B. The layout cell 20A includes SRAM cells 10Aa, 10Ab, 10Ac and 10Ad, and the layout cell 20B includes. SRAM cells 10Ba, 10Bb, 10Bc and 10Bd.

The layout cells 20A and 20B are substantially the same, and the following description focuses on the layout cell 20A. In the layout cell 20A, the local power supply line VDDL is formed in the middle part of the layout cell 20A along the second direction. The SRAM cells are symmetrical to each other with respect to the local power supply line VDDL in the second direction. The local power supply line VDDL is formed inside the layout cell 20A.

The layout cell 20A of this embodiment includes two local ground lines VSSL. The internal cell line to serve as the cross-coupling node and the local power supply line VDDL are placed between the two local ground lines VSSL. Further, the word line WL is placed in parallel with the local ground line VSSL on the side which is farther from the local power supply line VDDL.

The local ground line VSSL of the layout cell 20A and the local ground line VSSL of the layout cell 20B are connected to each other in the tap region 21. In the tap region 21, the local ground line VSSL is connected with the global ground line VSSG through the via hole 15. The local power supply line VDDL of the layout cell 20A and the local power supply line VDDL of the layout cell 20B are connected through a layer (e.g. a polysilicon line) 22 which is placed between the layout cells 20A and 20B. In the tap region 21, the polysilicon line 22 is connected with the global power supply line VDDG through the via hole 15. The word lines WL of the layout cells 20A and 20B are connected to each other in the tap region 21.

Figure 4:
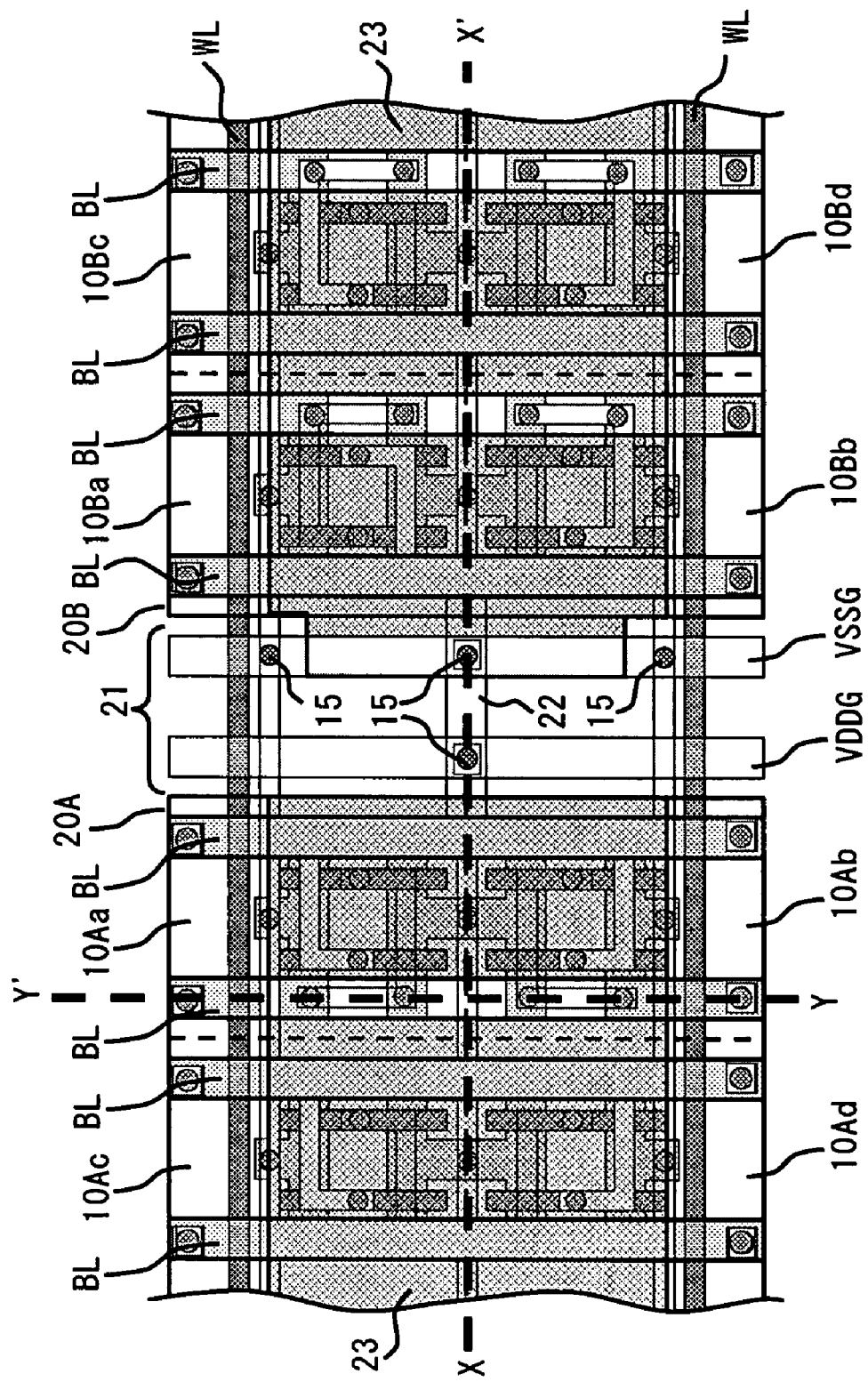
FIG. 4 is a view showing the layout where a shield line and a bit line are placed in an upper layer of the layout shown in FIG. 3.

In the semiconductor apparatus of this embodiment, a shield line 23 and an input/output line (e.g. a bit line BL) are placed in an upper layer of the SRAM cell in addition to the layout shown in FIG. 3. FIG. 4 schematically shows the layout where the shield line 23 and the bit line BL are placed. As shown in FIG. 4, the shield line 23 is formed to cover the internal cell line 14 of the SRAM cell and the local power supply line VDDL within the SRAM cell. The shield line 23 which is placed in the upper layer of the layout cell 20B is connected with the global ground line VSSG through the via hole 15 in the tap region 21. The shield line 23 which is placed in the upper layer of the layout cell 20A is also connected with the global ground line VSSG through the via hole 15, though not shown.

The bit line BL is connected to the input/output terminals IN/OUT1 and IN/OUT2 of the SRAM cells respectively through the via holes 15. The bit line BL is placed in a layer above the shield line 23.

Figure 5:
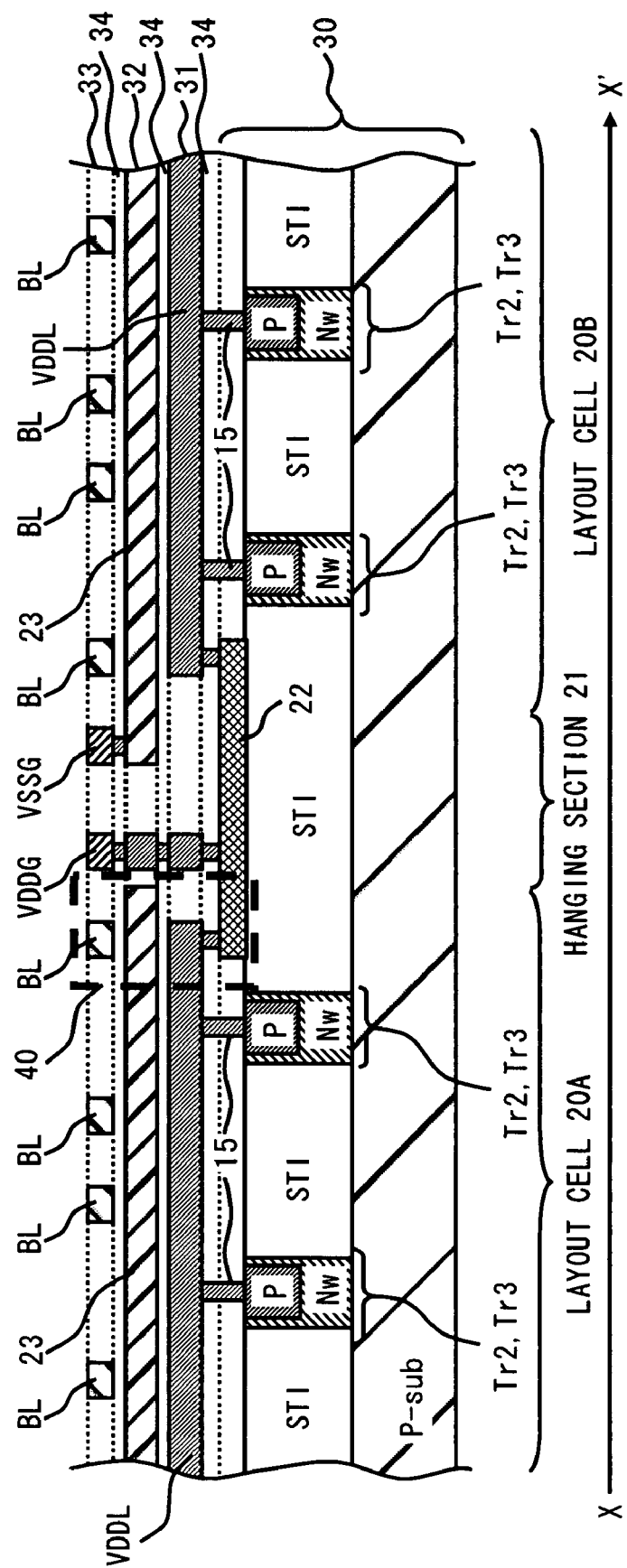
FIG. 5 is a cross-sectional view along line X-X' of the layout shown in FIG. 4.
Figure 7:
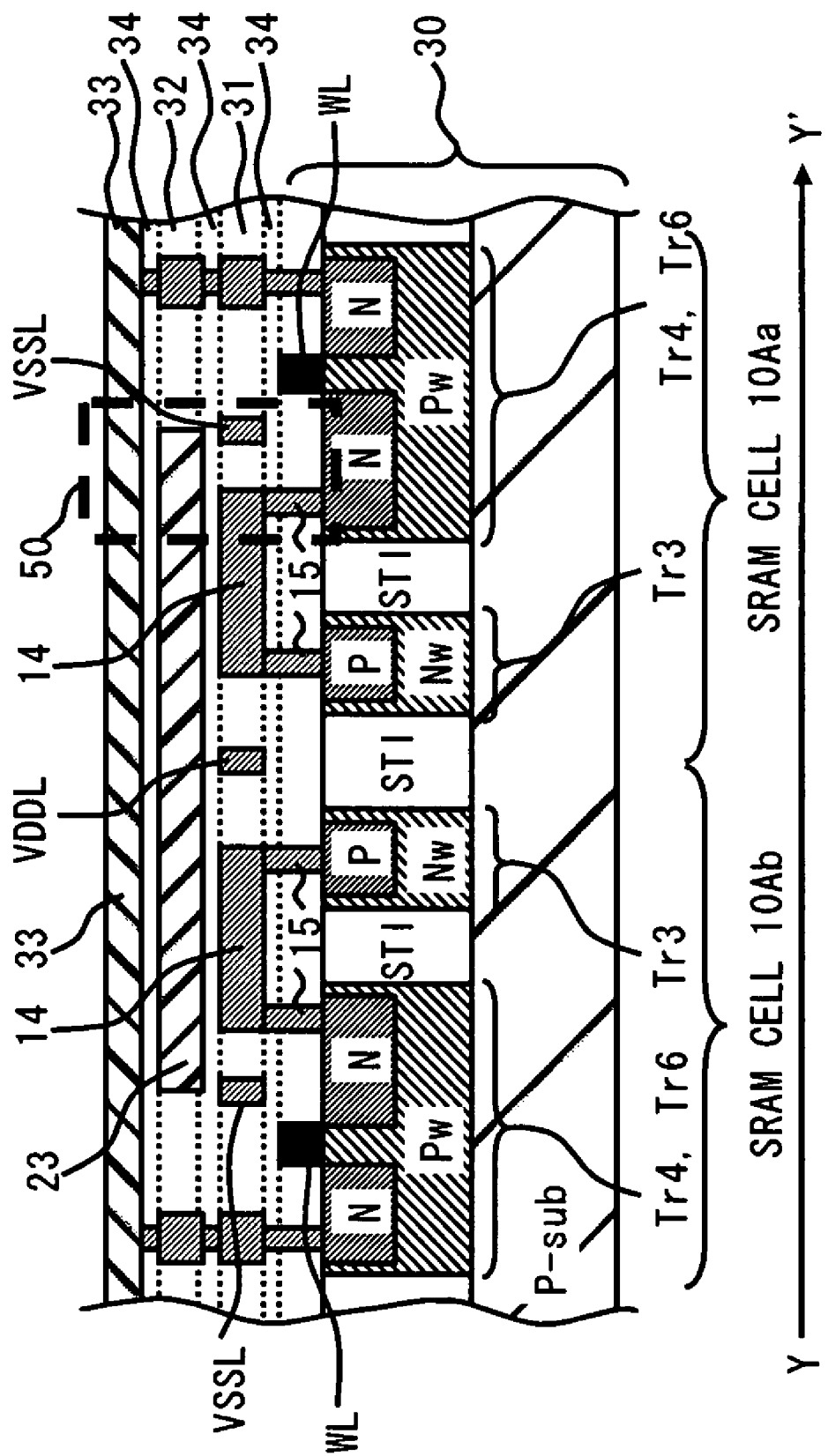
FIG. 7 is a cross-sectional view along line Y-Y' of the layout shown in FIG. 4.

FIG. 5 shows the cross section of the semiconductor apparatus having the layout shown in FIG. 4 along the first direction (X-X'). FIG. 7 shows the cross section of the semiconductor apparatus along the second direction (Y-Y') The layout of FIG. 4 is described in further detail hereinafter.

The cross-sectional view of the semiconductor apparatus along line X-X' shown in FIG. 5 is described first. As shown in FIG. 5, the semiconductor apparatus includes a device placement layer 30, an internal layer 31, a shield line layer 32, an input/output line layer 33, and an insulating layer 34. The layers are laminated in the order of the device placement layer 30, the internal layer 31, the shield line layer 32 and the input/output line layer 33 from the bottom, and the insulating layer 34 is placed between these layers.

In the device placement layer 30, an N-type well area Nw, which serves as a well area of the transistors Tr2 and Tr3, is formed by an N-type semiconductor on top of a substrate area P-sub. On top of the N-type well area Nw, a P-type diffusion area P, which serves as the drains of the transistors Tr2 and Tr3, is formed by a P-type semiconductor. In the same layer as the N-type well area Nw and the P-type diffusion area P, a device separation area STI is formed in the part where the devices are not formed. In the part to serve as the tap region 21 above the P-type diffusion area P or the device separation area STI, the polysilicon line 22, which connects the local power supply lines VDDL of the layout cells 20A and 20B, is formed.

In the internal layer 31, the local power supply line VDDL is formed in the area corresponding to the layout cells 20A and 20B. The local power supply line VDDL is connected to the P-type diffusion area P, which is placed in the device placement layer 30, through the via hole 15. The local power supply line VDDL is also connected to the polysilicon line 22, which is placed in the device placement layer 30, through the via hole 15.

In the shield line layer 32, the shield line 23 is formed in the area corresponding to the layout cells 20A and 20B. The shield line 23 which is formed in the area corresponding to the layout cell 20B is formed to extend under the global ground line VSSG which is formed in the input/output line layer 33. The shield line 23 which is formed in the area corresponding to the layout cell 20A, which is not shown, is also formed to extend under the global ground line VSSG which is formed in the input/output line layer 33.

In the input/output line layer 33, a bit line BL, a global power supply line VDDG and a global ground line VSSG are formed. The bit line BL is formed in the area corresponding to the layout cells 20A and 20B. The global power supply line VDDG and a global ground line VSSG are formed in the area corresponding to the tap region 21. The global power supply line VDDG is connected to the polysilicon line 22 in the device placement layer 30 through the via hole 15. The global ground line VSSG is connected to the shied line 23 through the via hole 15. In FIG. 5, the global ground line VSSG is connected with the shied line 23 which is formed in the layout cell 20B.

Figure 6:
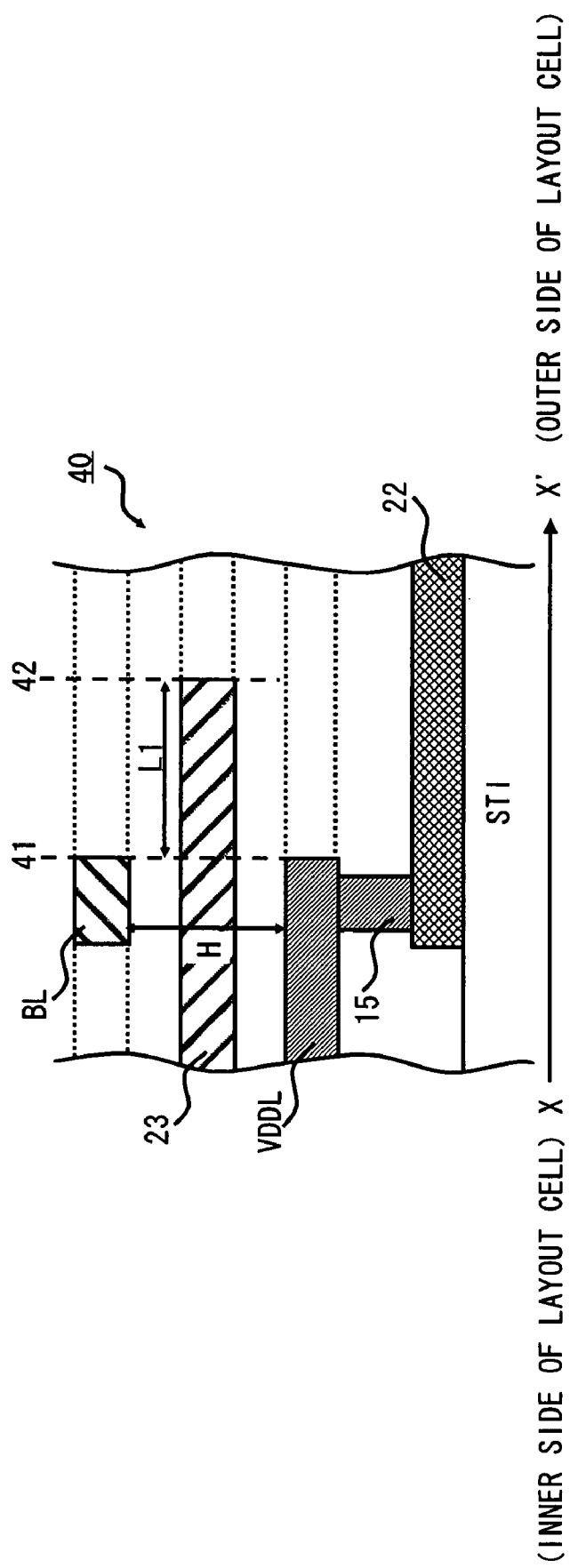
FIG. 6 is an enlarged view of an area 40 in the cross-sectional view of FIG. 5.

The shape of an end of the shield line 23 in the first direction is described hereinafter in detail. FIG. 6 shows an enlarged view of the area 40 of FIG. 5, and the shape of an end 42 of the shield line 23 in the first direction is described with reference to FIG. 6. As shown in FIG. 6, the end 42 of the shield line 23 in the first direction is placed in the outer part of the layout cell compared with an end 41, which is either the end of the local power supply line VDDL or the end of the bit line BL that is the closest to the periphery of the layout cell along the second direction. In FIG. 6, the end of the local power supply line VDDL and the end of the bit line BL are placed in the same position with respect to the first direction. The end 42 of the shield line 23 in the first direction is preferably placed in the outer part of the layout cell compared with the end 41, which is the end of the internal cell line 14 in the first direction, the end of the local power supply line VDDL in the first direction, or the end of the bit line BL in the first direction that is the closest to the periphery of the layout cell along the second direction. A length L1 of the shield line 23 which is extended outside of the end 41 is preferably longer than a length H which is from the front surface of the local power supply line VDDL to the bottom surface of the bit line BL.

The cross section of the semiconductor apparatus along line Y-Y' in FIG. 7 is described hereinafter. As shown in FIG. 7, the semiconductor apparatus includes the device placement layer 30, the internal layer 31, the shield line layer 32, the input/output line layer 33, and the insulating layer 34. These layers are laminated in the order of the device placement layer 30, the internal layer 31, the shield line layer 32 and the input/output line layer 33 from the bottom, and the insulating layer 34 is placed between the layers.

In the cross-sectional view shown in FIG. 7, the SRAM cell 10Ab is formed on the left side and the SRAM cell 10Aa is formed on the right side so that their cross-sectional structures are symmetrical to each other. In the following description, the area corresponding to the SRAM cell 10Aa is described by way of illustration.

In the device placement layer 30, an N-type well area Nw and a P-type well area Pw are formed above the substrate area P-sub. The N-type well area Nw serves as a well area of the transistor Tr3, and it is formed by an N-type semiconductor. The P-type well area Pw serves as a well area of the transistors Tr4 and Tr6, and it is formed by a P-type semiconductor. Above the N-type well area Nw, a P-type diffusion area P, which serves as the drain of the transistor Tr3, is formed by a P-type semiconductor. Above the P-type well area Pw, an N-type diffusion area N, which serves as the source or the drain of the transistors Tr4 and Tr6, is formed by an N-type semiconductor. In the same layer as the N-type well area Nw, the P-type diffusion area P, the P-type well area Pw and the N-type diffusion area N, a device separation area STI is formed in the part which does not operate as devices. Above the P-type well area Pw, a word line WL is formed as the gate of the transistor Tr6 in the part which serves as the transistor Tr6.

In the internal layer 31, the internal cell line 14, the local power supply line VDDL and the local ground line VSSL are formed. The local power supply line VDDL is formed in the area where the SRAM cell 10Aa and the SRAM cell 10Ab are connected. The internal cell line 14 is formed between the local power supply line VDDL and the local ground line VSSL. The internal cell line 14 is formed to cover a part of the P-type diffusion area P of the transistor Tr3 and a part of the N-type diffusion area N of the transistors Tr4 and Tr6. The internal cell line 14 is connected to the P-type diffusion area P and the N-type diffusion area N through the via holes 15.

In the shield line layer; 32, the shield line 23 is formed to cover the internal cell lines 14 of the SRAM cell 10Aa and the SRAM cell 10Ab. In the input/output line layer 33, the bit line BL is formed. The bit line BL is connected to the N-type diffusion area N of the transistors Tr6 through the via hole 15.

Figure 8:
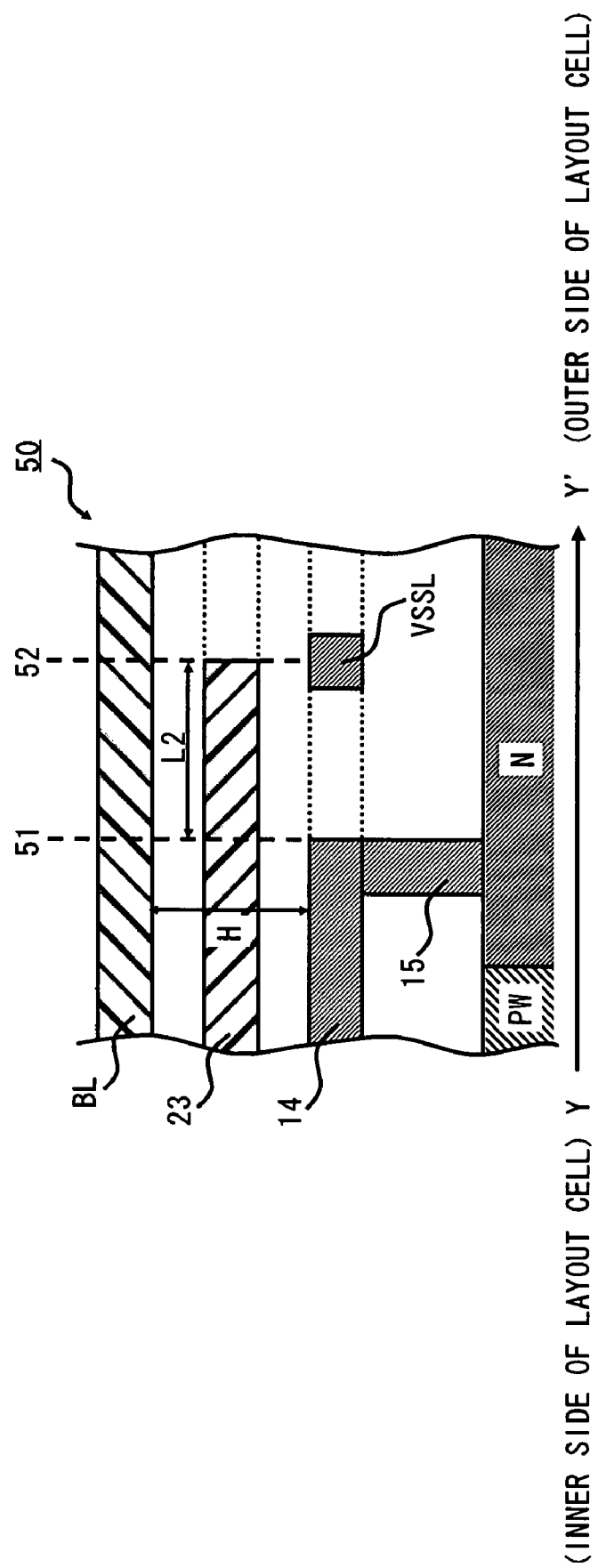
FIG. 8 is an enlarged view of an area 50 in the cross-sectional view of FIG. 7.

The shape of an end of the shield line 23 in the second direction is described hereinafter in detail. FIG. 8 shows an enlarged view of the area 50 of FIG. 7, and the shape of an end 52 of the shield line 23 in the second direction is described with reference to FIG. 8. As shown in FIG. 8, the end 52 of the shield line 23 in the second direction is placed in the outer part of the layout cell compared with an end 51 of the internal cell line 14 that is the closest to the periphery of the layout cell along the first direction. A length L2 of the shield line 23 which is extended outside of the end 51 is preferably longer than a length H which is from the front surface of the internal cell line 14 to the bottom surface of the bit line BL. If the local ground line VSSL is placed outside of the layout cell of the internal cell line 14, the shield line 23 preferably extends to reach the area above the local ground line VSSL.

As described in the foregoing, the shied line 23 is placed to cover the internal cell line 14 within the layout cell and the local power supply line VDDL. Therefore, a shielding is placed between the internal cell line 14 or the local power supply line VDDL and the bit line BL. It is thereby possible to prevent voltage variation in the internal cell line 14 as the cross-coupling node and the local power supply line VDDL from interfering with the bit line BL. Further, the shied line 23 is formed in the area larger than the area where the internal cell line 14 and the local power supply line VDDL are formed. It is thereby possible to prevent the interference of the internal cell line 14 and the local power supply line VDDL with the bit line BL which is located obliquely to these lines.

The shield line 23 of this embodiment is formed in the area larger than the area where the internal cell line 14 and the local power supply line VDDL are formed. The shield line 23 thereby protects the internal cell line 14 and the local power supply line VDDL which are placed therebelow from damages caused by etching or the like. Therefore, the internal cell line 14 and the local power supply line VDDL are not subject to damages from etching or the like in the processes after the process of forming the shield line 23.

Second Embodiment

Figure 9:
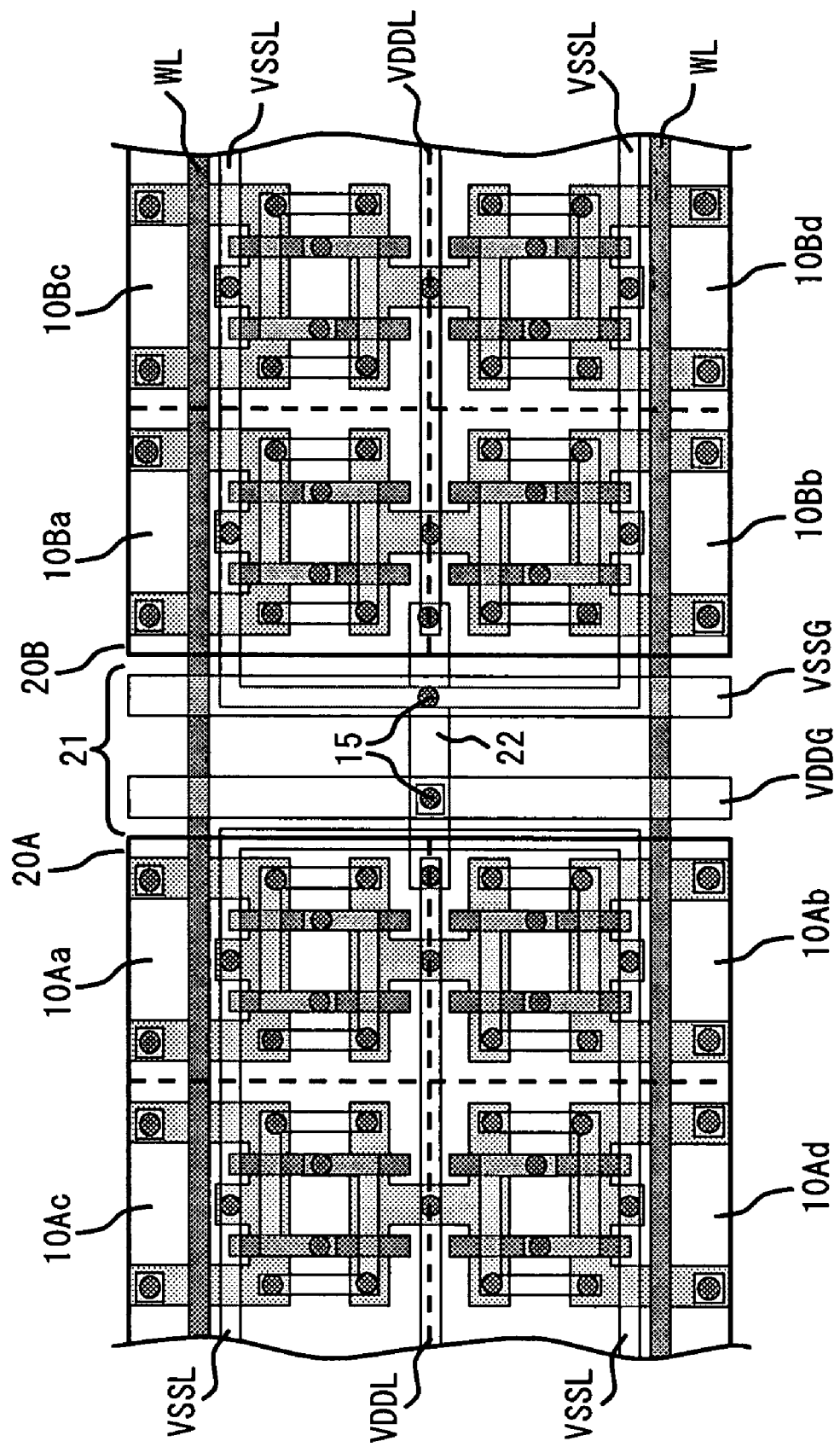
FIG. 9 is a view showing the layout of an SRAM using the layout cell according to a second embodiment of the present invention.

A semiconductor apparatus according to the second embodiment of the present invention is substantially the same as the semiconductor apparatus according to the first embodiment except for the connection of the local ground line VSSL. The layout cell of the semiconductor apparatus according to the first embodiment is such that the internal cell line 14 is placed between the two local ground lines VSSL, and the two local ground lines VSSL are connected by the global ground line VSSG in the tap region 21. On the other hand, the layout cell according to the second embodiment is such that the local ground line VSSL is placed to surround the internal cell line 14 and the local power supply line VDDL. FIG. 9 schematically shows the layout of the semiconductor apparatus according to the second embodiment.

As shown in FIG. 9, in the layout of the second embodiment, the local ground line VSSL of the layout cell 20B is connected to the global ground line VSSG through the via hole 15 in the tap region 21. The local ground line VSSL of the layout cell 20A is connected to the global ground line VSSG in a tap region which is not shown.

Figure 10:
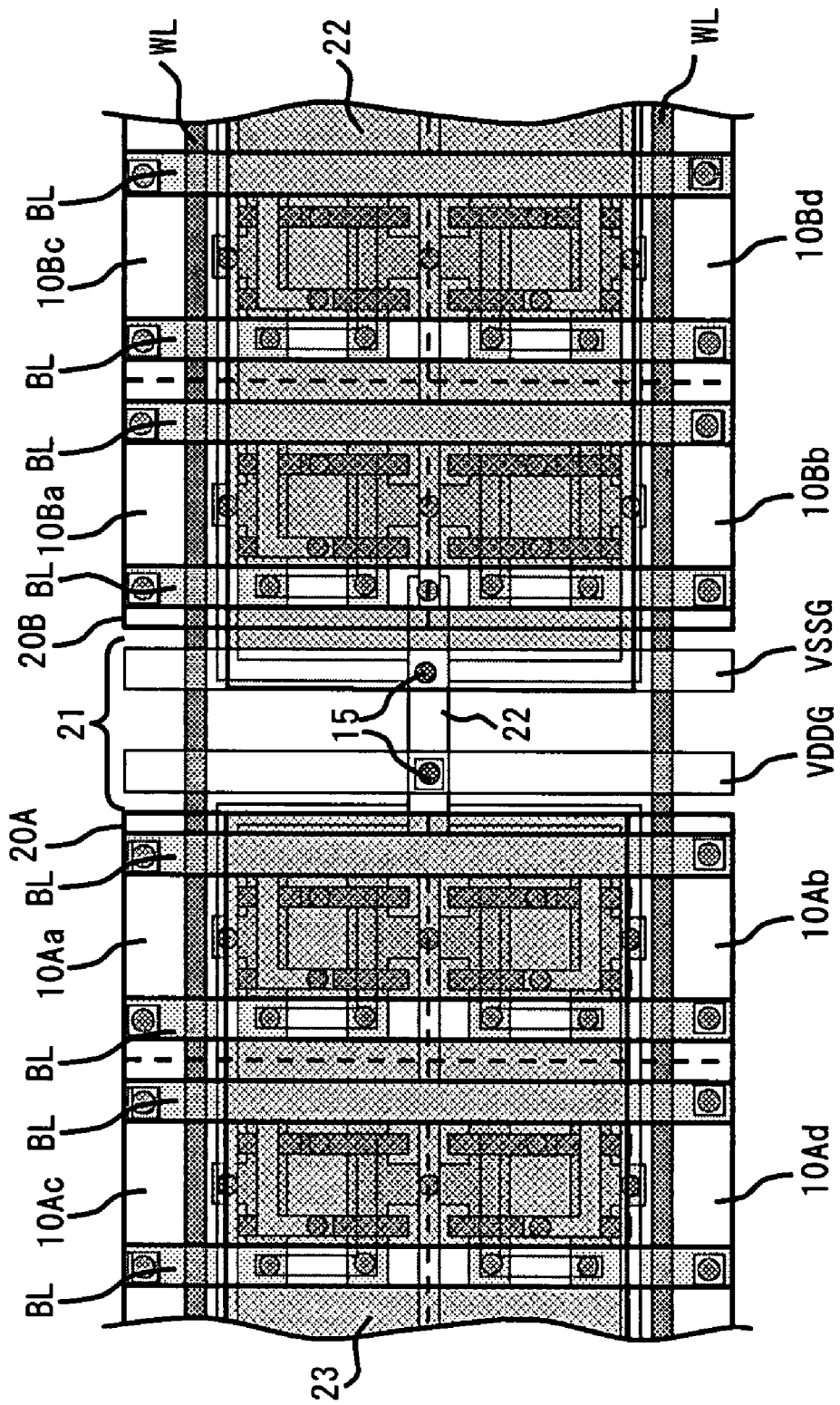
FIG. 10 is a view showing the layout where a shield line and a bit line are placed in an upper layer of the layout shown in FIG. 9.
Figure 11:
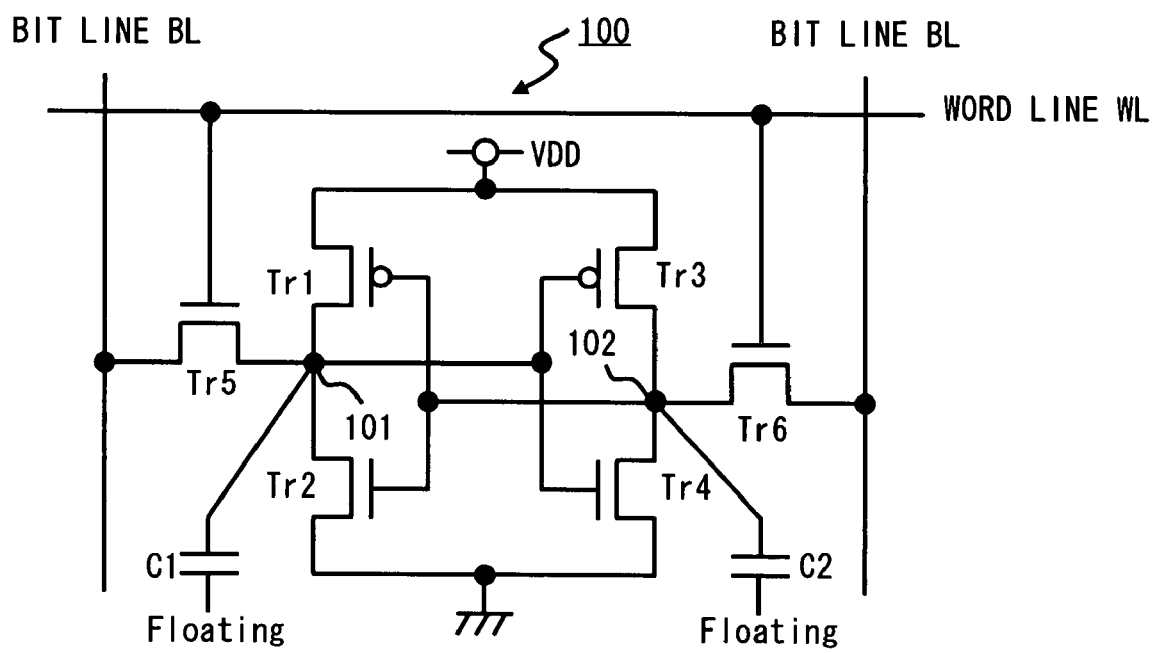
FIG. 11 is a circuit diagram of an SRAM according to a related art.
Figure 12:
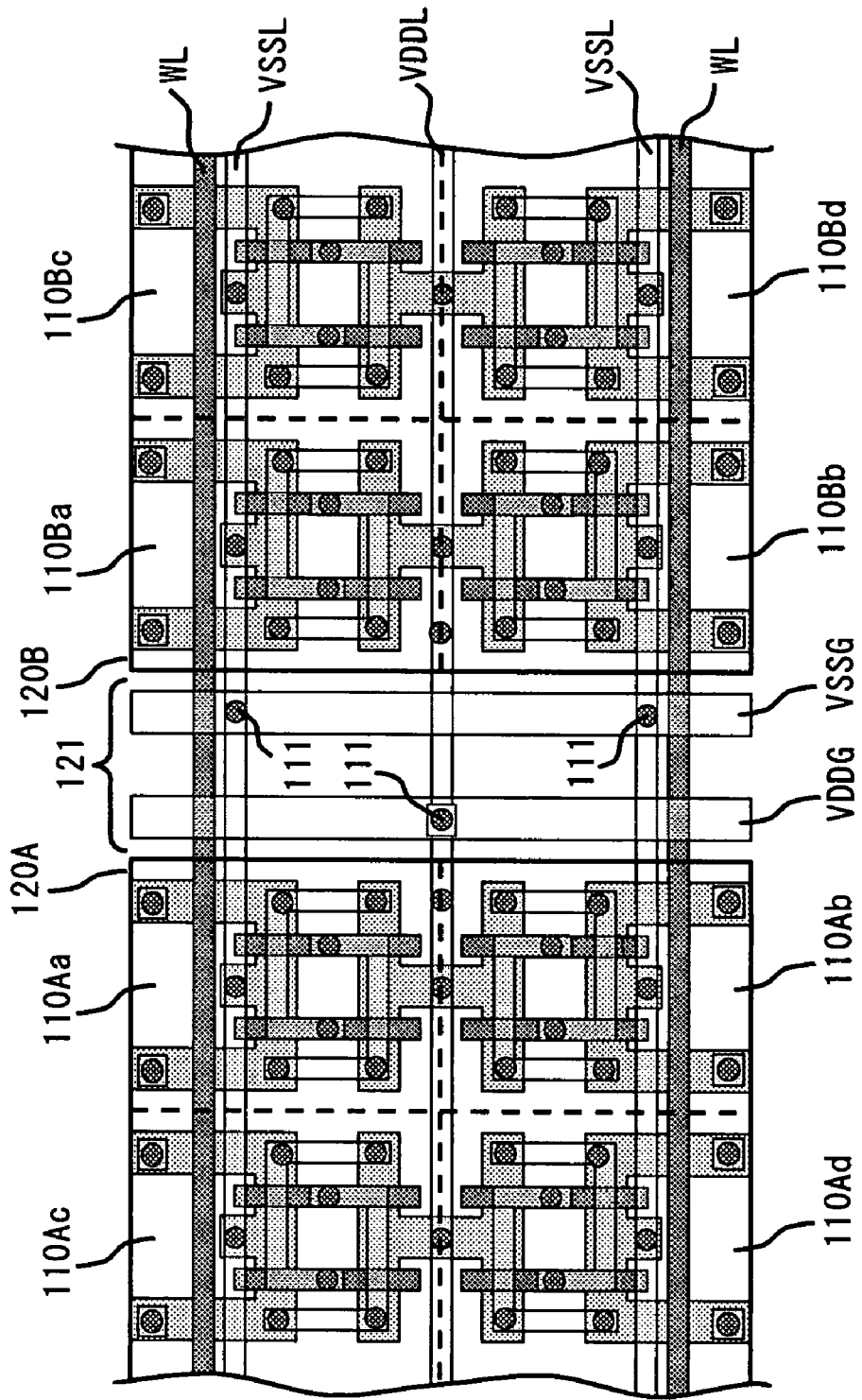
FIG. 12 is a view showing the layout of the SRAM according to the related art.
Figure 13:
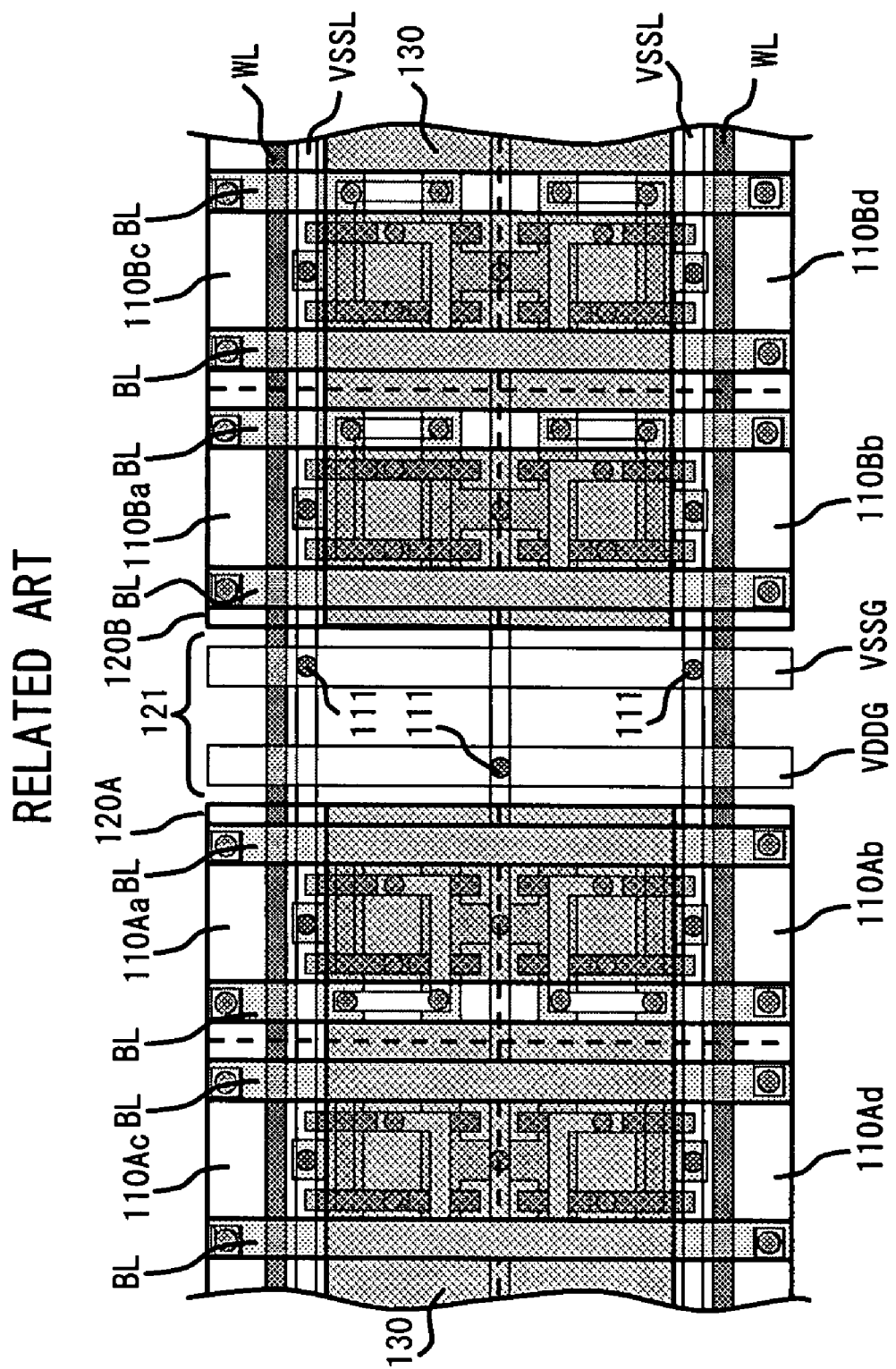
FIG. 13 is a view showing the layout where a additional capacitor and a bit line are placed in an upper layer of the layout shown in FIG. 12.

FIG. 10 shows the layout in which the shield line and the bit line are added to the layout of FIG. 9 according to the second embodiment. As shown in FIG. 10, in the layout cell according to the second embodiment, the shield line 23 is formed to cover the area surrounded by the local ground line VSSL. The shield line 23 is connected to the global ground line VSSG in the semiconductor apparatus of the second embodiment as well.

The local ground line VSSL thereby serves as a shield line on the sides of the internal cell line 14, and the shield line 23 serves as a shield line on top of the internal cell line 14. Thus, the layout cell of the second embodiment is such that the shield lines are located both upward and sideward. The semiconductor apparatus of the second embodiment thereby prevents interference more effectively than the semiconductor apparatus of the first embodiment.

It is apparent that the present invention is not limited to the above embodiment that may be modified and changed without departing from the scope and spirit of the invention. For example, the shapes of the SRAM cell and the layout cell are not restricted to the examples described in the above embodiments.

In addition, if a additional capacitor is connected to a cross-coupling node and the local ground line or the global ground line, the shield line can be used as a electrode (e.g. ground side electrode) of the additional capacitor. In this case, both of the effects of increase in immunity against soft error and decrease of interference can be obtained.

What is claimed is:

1. A semiconductor apparatus, comprising:
   an internal layer which connects together a plurality of transistor nodes that are formed in a layout cell;
   a first power supply line which provides a predetermined voltage to the layout cell;
   an input/output line which is connected to an input/output terminal of the plurality of transistors in the layout cell; and
   a shield line placed between the internal layer and the input/output line so as to cover the internal layer and the first power supply line,
   wherein the internal layer, the first power supply line, the shield line, and the first power supply line are provided in that order from a semiconductor substrate.

2. The semiconductor apparatus according to claim 1, wherein
   an end of the shield line in a first direction is placed in an outer part of the layout cell compared with an end which is the closest to a periphery of the layout cell along the second direction, the end selected from an end of the first power supply line and an end of the internal cell line, and
   an end of the shield line in the second direction is placed in an outer part of the layout cell compared with an end of the internal cell line which is the closest to a periphery of the layout cell along the first direction.

3. The semiconductor apparatus according to claim 1, wherein
   an end of the shield line in a first direction is placed in an outer part of the layout cell compared with an end which is the closest to a periphery of the layout cell along a second direction, the end selected from an end of the first power supply line or an end of the internal cell line which is the closest to the periphery of the layout cell along the second direction and an end of the input/output line placed above the layout cell which is the closest to the periphery of the layout cell along the second direction, and an end of the shield line in the second direction is placed in an outer part of the layout cell compared with an end of the internal cell line which is the closest to a periphery of the layout cell along the first direction.

4. The semiconductor apparatus according to claim I, wherein an end of the input/output line placed above the layout cell which is the closest to a periphery of the layout cell along a second direction is placed in an inner part of the layout cell compared with an end which is the closest to a periphery of the layout cell along a first direction, the end selected from an end of the shield line in the first direction, an end of the first power supply line and an end of the internal cell line.

5. The semiconductor apparatus according to claim 2, wherein the first direction comprises a longitudinal direction of the first power supply line, and the second direction is substantially orthogonal to the first direction.

6. The semiconductor apparatus according to claim 3, wherein the first direction comprises a longitudinal direction of the first power supply line, and the second direction is substantially orthogonal to the first direction.

7. The semiconductor apparatus according to claim 4, wherein the first direction comprises a longitudinal direction of the first power supply line, and the second direction is substantially orthogonal to the first direction.

8. The semiconductor apparatus according to claim 1, wherein the layout cell further includes second power supply lines to provide a second power supply to transistors in the layout cell, and the internal cell line and the first power supply line arranged in parallel with the second power supply lines are placed in an area between the second power supply lines.

9. The semiconductor apparatus according to claim 1, wherein the layout cell includes at least one Static Random Access Memory (SRAM) cell.

10. The semiconductor apparatus according to claim 9, wherein the shield line comprises a electrode of a additional capacitor that is connected with a cross-coupling node of the SRAM cell and the first power supply line.

11. The semiconductor apparatus according to claim 1, wherein a plurality of layout cells are arranged adjacent to each other through a tap region where a global power supply line to provide a power supply to the plurality of layout cells is placed.

12. A semiconductor device, comprising:
a plurality of transistors formed in a layout cell;
an internal layer which is arranged in said layout cell to connect said transistor therebetween;
a first power supply line which is arranged in said layout cell to provide voltage to the transistors in the layout cell;
a conductive line which is arranged on said internal layer in said layout cell to provide voltage to the transistors; and
a shield line placed between the internal layer and the conductive line so as to cover the internal layer and first power supply line, said shield line projecting from an edge of the first power supply line,
wherein the internal layer, the first power supply line, the shield line, and the conductive line are provided in that order from a semiconductor substrate.

13. A semiconductor device, comprising:
a first layout cell;
a second layout cell provided adjacently to said first layout cell via a tap region;
wherein each of first and second layout cells comprises:
a plurality of transistors; and
a power supply line coupled to the plurality of transistors in the correspondingly one of the first to second layout cell,
a power source layer formed on the tap region to connect the power supply line in the first layout cell and the power supply line in the second layout cell; and
a shield line which covers the power supply line in the first and second layout cells and extends to the tap region to be provided under the power source layer to be connected to the power source layer.

14. The semiconductor device of claim 13, further comprising:
a third layout cell provided adjacently to said second layout cell without the tap region intervening therebetween, coupled to the power supply line, and covered with the shield line.

* * * * *